United States Patent [19]
Yang et al.

[11] Patent Number: 6,064,279
[45] Date of Patent: May 16, 2000

[54] RF OFFSET CIRCUIT USING A HALF WAVELENGTH TRANSMISSION LINE

[75] Inventors: Jun-seok Yang, Seoul; Yong-chae Jeong, Kyungki-do, both of Rep. of Korea

[73] Assignee: Samsung Electronics Co., Ltd., Rep. of Korea

[21] Appl. No.: 09/203,914

[22] Filed: Dec. 2, 1998

[30] Foreign Application Priority Data

Dec. 2, 1997 [KR] Rep. of Korea ............ 97-65178

[51] Int. Cl.[7] .................................... H03H 7/48
[52] U.S. Cl. ............................ 333/136; 333/131
[58] Field of Search .......................... 333/127, 128, 333/131, 136

[56] References Cited

U.S. PATENT DOCUMENTS

| | | | |
|---|---|---|---|
| 4,310,814 | 1/1982 | Bowman | 333/121 |
| 4,697,191 | 9/1987 | Cross | 343/809 |
| 4,949,398 | 8/1990 | Maas | 455/326 |
| 4,988,962 | 1/1991 | Janer | 333/136 |
| 5,334,957 | 8/1994 | Koontz | 333/131 |
| 5,583,468 | 12/1996 | Kielmeyer et al. | 333/33 |
| 5,789,996 | 8/1998 | Borodulin | 333/117 |

*Primary Examiner*—Benny Lee
*Assistant Examiner*—Justin P. Bettendorf
*Attorney, Agent, or Firm*—Dilworth & Barrese

[57] ABSTRACT

An RF signal offset circuit using a half wavelength transmission line is provided. The RF signal offset circuit includes an RF transformer having an input coil and an output coil. The input coil has first and second input ports. The output coil has first and second output ports. One of the output ports is grounded. A half wavelength transmission line having first and second ends is connected in parallel to the input coil of the RF transformer. First and second resistance devices are respectively connected between the first end of the transmission line and the first input port of the RF transformer and between the second end of the transmission line and the second input port of the RF transformer.

10 Claims, 4 Drawing Sheets

WILKINSON POWER COMBINER

3dB HYBRID COUPLER

RF TRANSFORMER

RF OFFSET CIRCUIT USING A HALF WAVELENGTH TRANSMISSION LINE

FIELD OF THE INVENTION

The present invention relates generally to radio frequency (RF) signals and, in particular, to an RF offset circuit for reducing intermodulation distortion (IMD).

DESCRIPTION OF THE RELATED ART

According to international organization for standardization IS-95, a mobile communication system typically includes a plurality of mobile terminals and a plurality of base stations for serving a predetermined area. A linear power amplifier (LPA) used in the mobile communication base station employs a feedforward to reduce intermodulation distortion (IMD). In furtherance of reducing IMD, the LPA requires a circuit for extracting intermodulation distortion generated by several carriers. Such a circuit is referred to as an RF offset circuit. Thus, in order to reduce IMD, the feedforward depends on the RF offset circuit to determine the offset amount of the RF signal.

Conventional feedforward circuitry has employed an RF offset circuit using only passive elements. As a result, the offset amount is dependent on the inherent characteristics of the passive elements. Therefore, conventional feedforward circuitry is, in effect, limited in being able to reduce intermodulation distortion.

FIGS. 1–3 are schematic diagrams of conventional RF offset circuits using a Wilkinson power combiner, a 3 dB hybrid coupler, and an RF transformer, respectively. In these conventional RF offset circuits, a signal portion of the two input signals having the same amplitude and phase are subtracted from the input signals.

As stated above, conventional RF offset circuits, which are constructed with passive elements, do not reduce intermodulation distortion as much as desired. As a result, alternative methods have been proposed.

SUMMARY OF THE INVENTION

It is an object of the present invention to provide an RF offset circuit using a half wavelength transmission line that increases the amount of IMD reduction at the output of an amplifier with feedforward circuitry by increasing the offset amount and regularly maintaining the amount in a wide band.

In one aspect of the invention, an RF signal offset circuit using a half wavelength transmission line includes: an RF transformer having an input coil and an output coil, the input coil having first and second input ports, the output coil having first and second output ports, wherein one of the output ports is grounded; a half wavelength transmission line having first and second ends connected in parallel to the input coil of said RF transformer; and first and second resistance devices respectively connected between the first end of said transmission line and the first input port of said RF transformer and between the second end of said transmission line and the second input port of said RF transformer.

These and other objects, features and advantages of the present invention will become apparent from the following detailed description of illustrative embodiments thereof, which is to be read in connection with the accompanying drawings.

DESCRIPTION OF THE INVENTION

In an embodiment of the present invention, an RF offset circuit with an RF transformer is connected to a transmission line through two resistance means. Such a configuration results in an increase in the offset characteristics as compared to prior art RF offset circuits.

Figure 1:
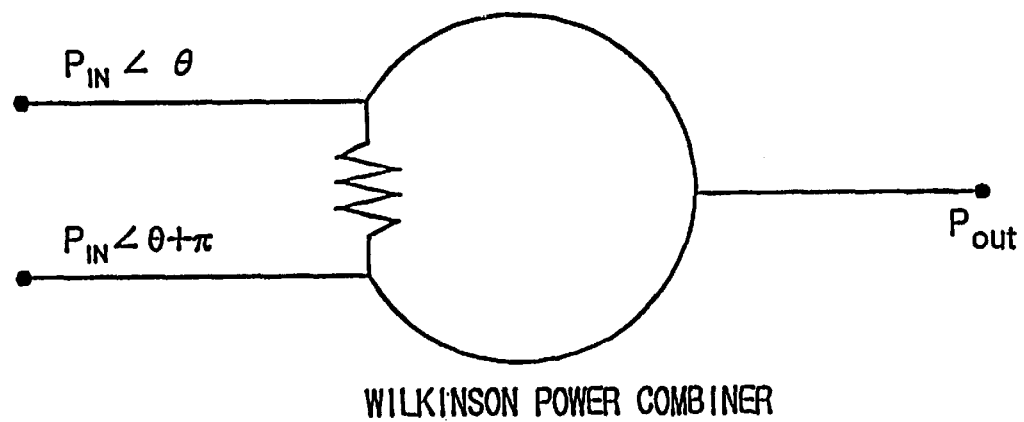
FIG. 1 is a schematic diagram of a conventional RF offset circuit using a Wilkinson power combiner.
Figure 2:
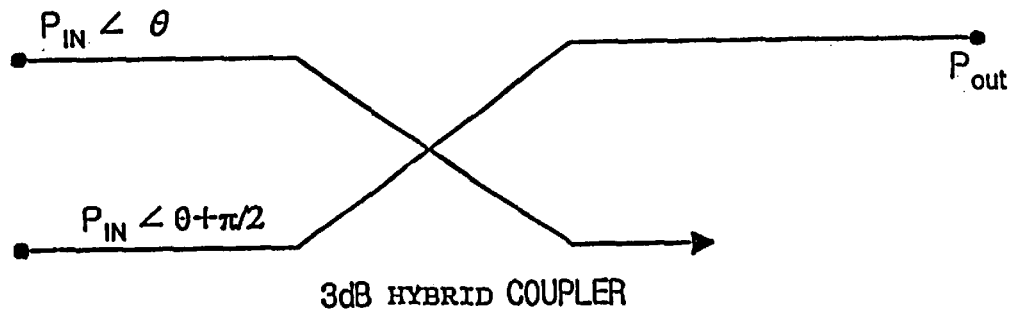
FIG. 2 is a schematic diagram of a conventional RF offset circuit using a 3 dB-hybrid coupler.
Figure 3:
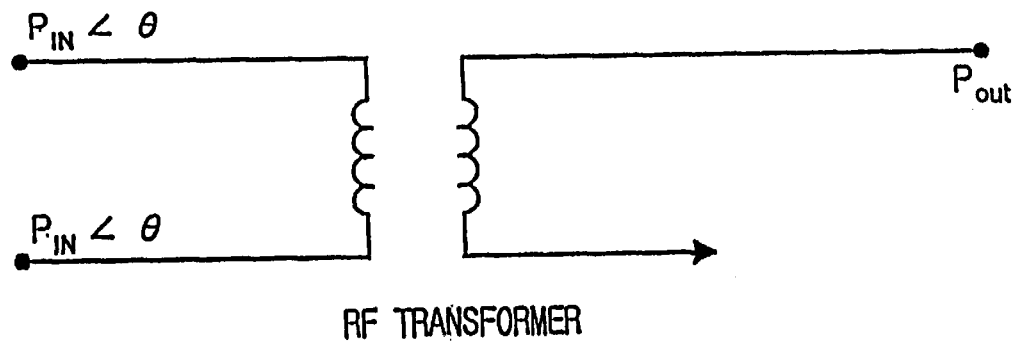
FIG. 3 is a schematic diagram of a conventional RF offset circuit using an RF transformer.
Figure 4:
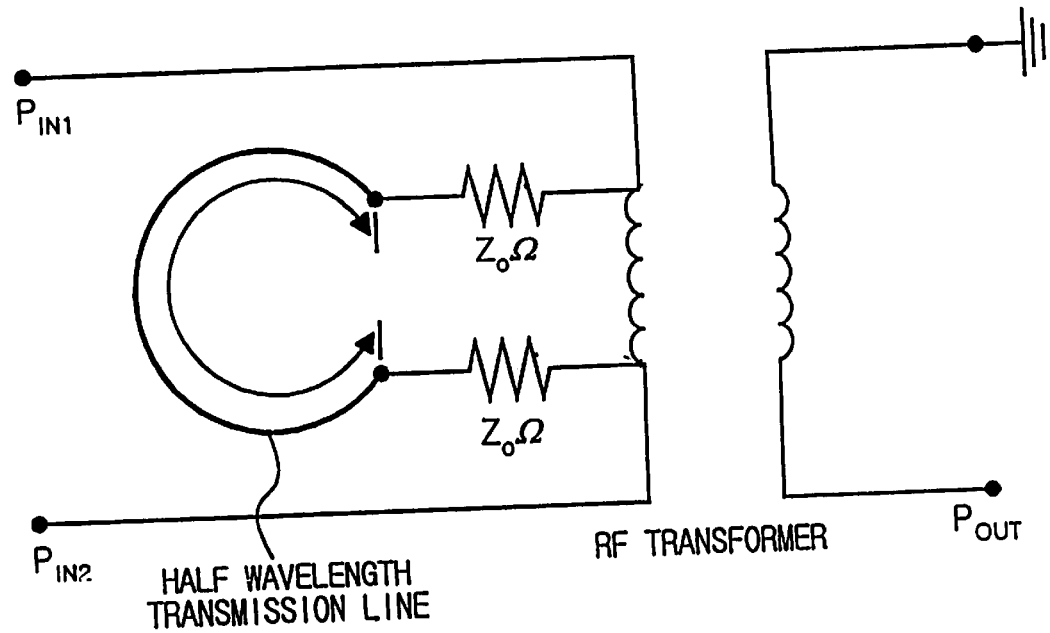
FIG. 4 is a schematic diagram of an RF offset circuit according to the present invention.

Referring to FIG. 4, a schematic diagram is shown of an RF offset circuit according to an embodiment of the present invention. The RF offset circuit includes an RF transformer having an input coil and an output coil. The input coil has first and second input ports. The output coil has first and second output ports, the first output port being connected to ground. A half wavelength transmission line having first and second ends is respectively connected in parallel to the input coil of the RF trans former. First and second resistance means are respectively connected between the first end of the transmission line and the first input port of the RF transformer and between the second end of the transmission line and the second input port of the RF transformer.

Two input signals to the RF offset circuit, $P_{IN1}$ and $P_{IN2}$, while different, are presumed to both include a common signal portion having the same amplitude and phase. The common portion of the input signals (i.e., those portions having the same amplitude and phase) will be subtracted through the offset circuit. Thus, $P_{OUT}$ is the output signal from the RF offset circuit having the common portion subtracted therefrom, and a wavelength $\lambda$ is a function of a single frequency.

By designating the common portions of input signals $P_{IN1}$ and $P_{IN2}$ (i.e., those portions having the same amplitude and phase) as 'A', the input signals $P_{IN1}$ and $P_{IN2}$ may be respectively determined according to the following equations.

$$P_{IN1} = A + B$$

$$P_{IN2} = A + C$$

Figure 5:
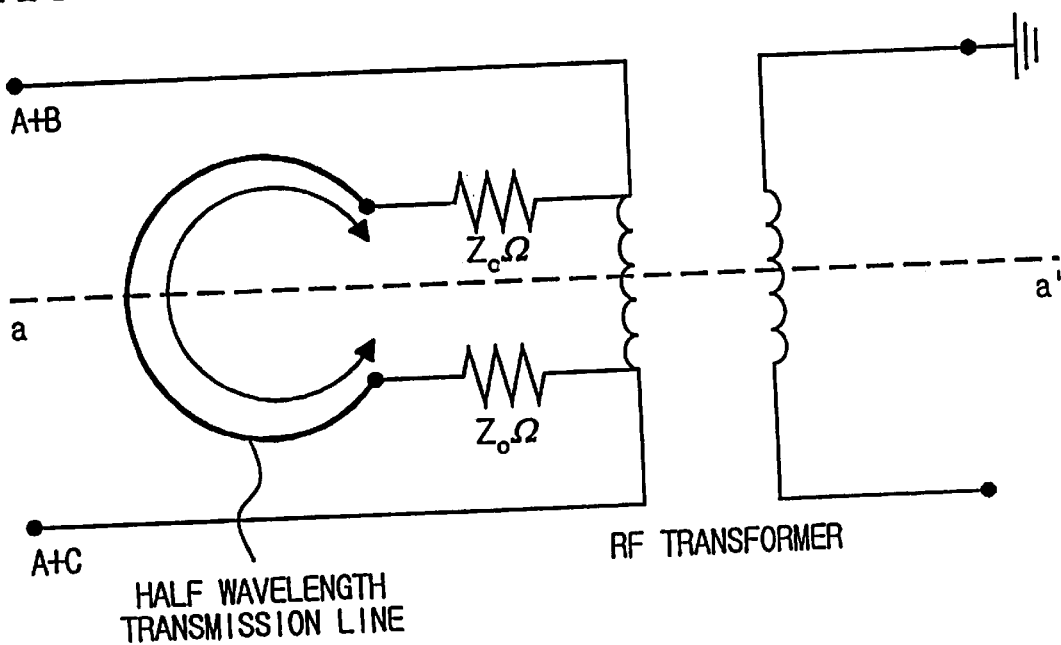
FIG. 5 is a schematic diagram of an RF offset circuit according to an embodiment of the present invention for two input signals which include signal portions having the same amplitude and the same phase.

FIG. 5 is a schematic diagram of an RF offset circuit according to an embodiment of the present invention for two input signals which include signal portions having the same amplitude and the same phase. As illustrated, the two input signals are designated as A+B and A+C, respectively. Due to the symmetry of the RF offset circuit of FIG. 5 with respect to a line $\overline{aa'}$, the entire circuit may be represented by the sum of the input signals, after the input signals are classified into even mode signal or odd mode signals. The following equations are used to represent the circuit of FIG. 5.

$$P_{IN1} = A + B = \left[A + \frac{(B+C)}{2}\right] - \left[\frac{(C-B)}{2}\right]$$

$$P_{IN2} = A + C = \left[A + \frac{(B-C)}{2}\right] + \left[\frac{(C-B)}{2}\right]$$

$$P_{IN1e} = A + \frac{(B+C)}{2}$$

$$P_{IN2e} = A + \frac{(B+C)}{2}$$

$$P_{IN1o} = -\left[\frac{(C-B)}{2}\right]$$

$$P_{IN2o} = \left[\frac{(C-B)}{2}\right]$$

Figure 6:
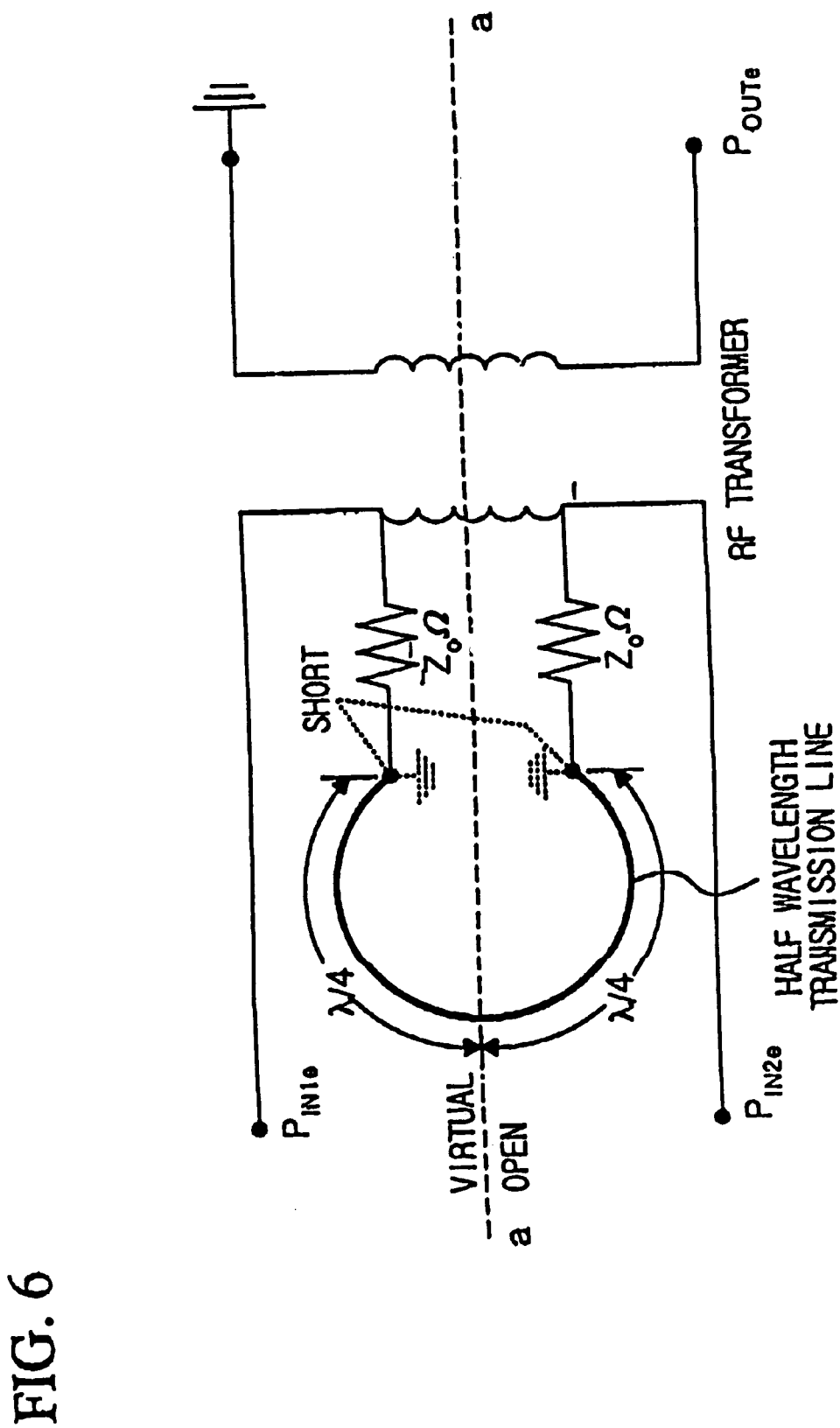
FIG. 6 is a schematic diagram illustrating the operation of the RF offset circuit of FIG. 4 when even mode input signals are applied thereto.

The operation of the RF offset circuit of FIG. 4 will hereinafter be explained with respect to FIGS. 6 and 7. FIG. 6 is a schematic diagram illustrating the operation of the RF offset circuit of FIG. 4 when even mode input signals are applied thereto. When even mode input signals are applied, a virtual open phenomenon occurs at a point where the RF half wavelength transmission line meets the symmetrical line ($\overline{aa'}$) and the transmission line is shortened λ/4 away from the point of the virtual open phenomenon, so that resistance $Z_0O$ is grounded. Consequently, the input signals are dissipated via the resistance $Z_0O$, and $P_{OUTe}$ becomes 0. Thus, as stated above, when even mode input signals are applied to the RF offset circuit of the present invention, the RF input signals are offset through an RF transformer and simultaneously offset through an existing half wavelength transmission line. As a result, the total offset amount increases.

Figure 7:
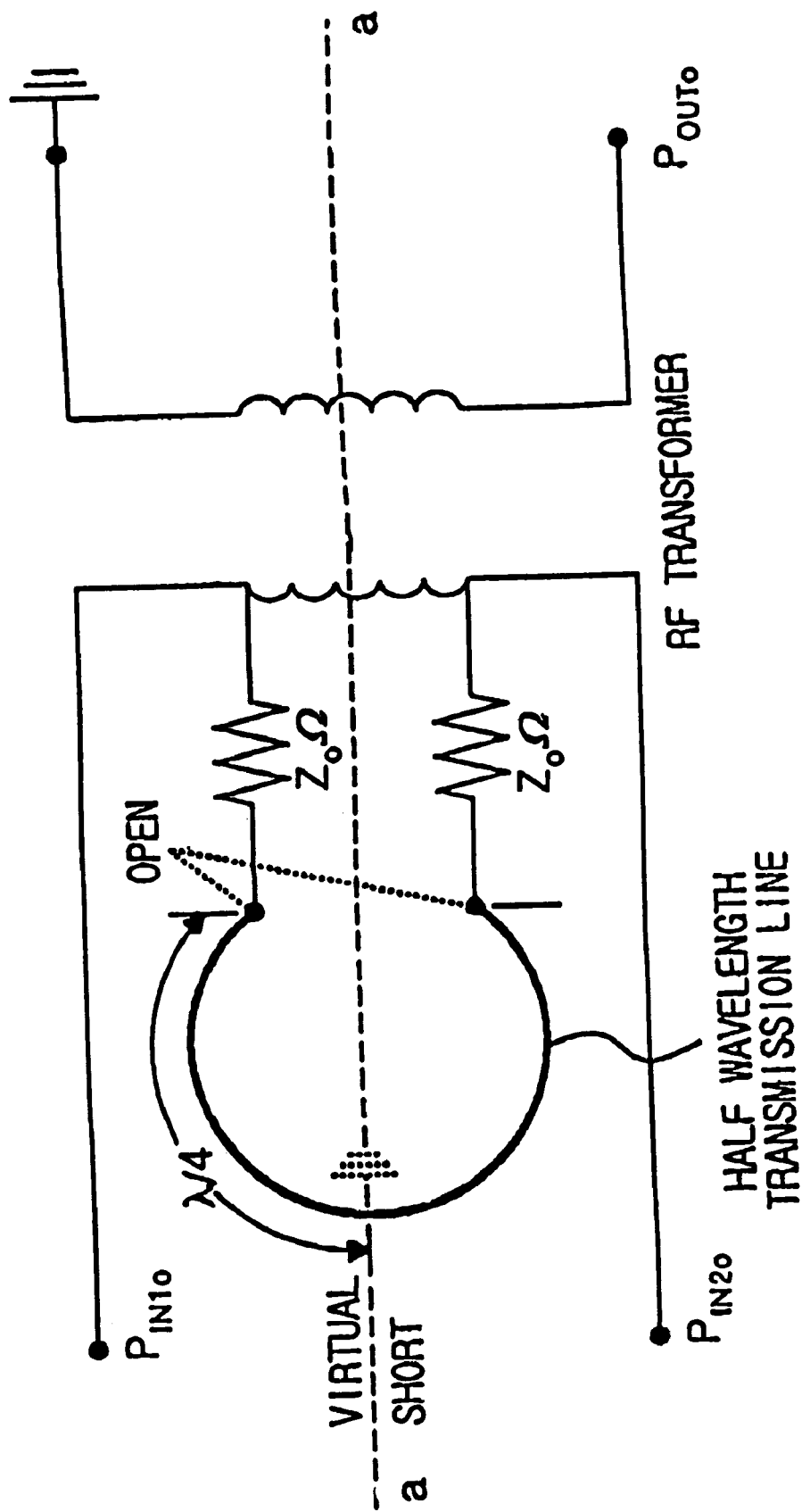
FIG. 7 is a schematic diagram illustrating the operation of the RF offset circuit of FIG. 4 when odd mode input signals are applied thereto.

FIG. 7 is a schematic diagram illustrating the operation of the RF offset circuit of FIG. 4 when odd mode input signals are applied thereto. As illustrated, when odd mode input signals are applied to the RF offset circuit, a virtual short phenomenon occurs at a point where the RF half wavelength transmission line meets the symmetrical line ($\overline{aa'}$) and the transmission line is open λ/4 away from the point of the virtual short phenomenon, so that resistance $Z_0O$ is open. Consequently, infinite impedances all are directed to the RF transformer, and $P_{OUTo}$ becomes C−B. Thus, as stated above, when odd mode input signals are applied, the odd mode RF input signals are transformed through the RF transformer without being offset.

As a result, only the signal portion (among the two RF input signals) having the same amplitude and phase is offset. The remainder of the signals are not affected by the half wavelength transmission line and comply with the RF transformer input signal form.

According to the present invention, intermodulation distortion generated by a feedforward amplifier is reduced by simply adding a half wavelength transmission line and two resistance means to the conventional RF transformer.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. An RF signal offset circuit using a half wavelength transmission line comprising:
    an RF transformer having an input coil and an output coil, the input coil having first and second input ports, the output coil having first and second output ports, wherein one of the output ports is grounded;
    a half wavelength transmission line having first and second ends connected in parallel to the input coil of said RF transformer; and
    first and second resistance means respectively connected between the first end of said transmission line and the first input port of said RF transformer and between the second end of said transmission line and the second input port of said RF transformer.

2. An RF signal offset circuit as set forth in claim 1, wherein said first and second resistance means have resistances associated therewith about equal to an impedance of the transmission line.

3. An RF signal offset circuit as set forth in claim 2, wherein only signal portions having about equal amplitude and phase of inputs signals input to the input ports of said RF transformer are offset and remaining signal portions of the input signals are output from said RF transformer.

4. An RF signal offset circuit as set forth in claim 3, wherein the offset signal portions of the input signals correspond to even mode input signals, when the input signals are separated into even mode input signals and odd mode input signals and interpreted as one of the even mode inputs signals and the odd mode input signals.

5. An RF signal offset circuit as set forth in claim 4, wherein a symmetrical line virtually crossing between a center of said RF transformer input ports and a center of said Rf transformer output ports is formed.

6. An RF signal offset circuit as set forth in claim 5, wherein a virtual open phenomenon occurs at a point where said half wavelength transmission line meets the symmetrical line, when the even mode input signals are applied.

7. An RF signal offset circuit as set forth in claim 6, wherein said half wavelength transmission line is shortened at a point λ/4 away from the point of the virtual open phenomenon and the first and second resistance means are grounded so that an output signal from said RF transformer becomes equal to about zero, when λ is a wavelength of the input signals.

8. An RF signal offset circuit as set forth in claim 7, wherein the RF input signals are offset simultaneously through said RF transformer and said half wavelength transmission line to increase a total offset amount.

9. An RF signal offset circuit as set forth in claim 5, wherein a virtual short phenomenon occurs at a point where said half wavelength transmission line meets the symmetrical line, when the odd mode input signals are applied.

10. An RF signal offset circuit as set forth in claim 9, wherein said half wavelength transmission line is open at a point λ/4 away from the point of the virtual short circuit and the first and second resistance means are open so that the input signals are directed to said RF transformer, when λ is a wavelength of the input signals.

* * * * *